United States Patent
Daicho et al.

(10) Patent No.: US 8,669,575 B2
(45) Date of Patent: Mar. 11, 2014

(54) LIGHT EMITTING MODULE, METHOD OF MANUFACTURING THE LIGHT EMITTING MODULE, AND LAMP UNIT

(75) Inventors: Hisayoshi Daicho, Shizuoka (JP); Yasuaki Tsutsumi, Shizuoka (JP); Takaaki Komatsu, Shizuoka (JP); Shogo Sugimori, Shizuoka (JP); Yuji Higashi, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 13/124,393

(22) PCT Filed: Oct. 9, 2009

(86) PCT No.: PCT/JP2009/005293
§ 371 (c)(1),
(2), (4) Date: Apr. 14, 2011

(87) PCT Pub. No.: WO2010/044240
PCT Pub. Date: Apr. 22, 2010

(65) Prior Publication Data
US 2011/0210369 A1    Sep. 1, 2011

(30) Foreign Application Priority Data
Oct. 15, 2008   (JP) ................................ 2008-266754

(51) Int. Cl.
*H01L 33/50* (2010.01)

(52) U.S. Cl.
USPC .......... 257/98; 257/13; 257/79; 257/E33.054; 257/E33.067

(58) Field of Classification Search
USPC ................ 257/98, E33.067, 79, 13, E33.054; 438/31
See application file for complete search history.

(56) References Cited

U.S. PATENT DOCUMENTS

2006/0164836 A1    7/2006   Suehiro et al.
2007/0236953 A1    10/2007  Nakazawa et al.
(Continued)

FOREIGN PATENT DOCUMENTS

| CN | 1393942 A | 1/2003 |
|---|---|---|
| JP | 2002257175 | 9/2002 |

(Continued)

OTHER PUBLICATIONS

International Preliminary Report on Patentability for International Application No. PCT/JP2009/005293, International Filing Date Oct. 9, 2009.
(Continued)

*Primary Examiner* — Marc Armand
(74) *Attorney, Agent, or Firm* — Buchanan Ingersoll & Rooney PC

(57) ABSTRACT

In a light emitting module 40, light wavelength conversion ceramic 58 converts the wavelength of the light emitted by a semiconductor light emitting element 52. The light wavelength conversion ceramic 58 is made so transparent that the light wavelength conversion ceramic 58 has 40 percent or more of the total light transmittance of the light with a wavelength within the conversion wavelength range. A reflective film 60 is provided on the surface of the light wavelength conversion ceramic 58 and narrows down the emission area of the light that has transmitted the light wavelength conversion ceramic 58 to an area smaller than the light emitting area of the semiconductor light emitting element 52. In the case, the reflective film 60 guides the light such that the light is emitted in the direction approximately parallel to the light emitting surface of the light emitting element 52.

9 Claims, 7 Drawing Sheets

(56) References Cited

U.S. PATENT DOCUMENTS

| | | | |
|---|---|---|---|
| 2007/0267646 A1* | 11/2007 | Wierer et al. | 257/98 |
| 2008/0290362 A1* | 11/2008 | Zhang et al. | 257/99 |
| 2009/0052158 A1* | 2/2009 | Bierhuizen et al. | 362/84 |
| 2009/0154137 A1* | 6/2009 | Bierhuizen et al. | 362/84 |
| 2010/0118530 A1* | 5/2010 | Nagai | 362/235 |

FOREIGN PATENT DOCUMENTS

| | | |
|---|---|---|
| JP | 2002-368286 | 12/2002 |
| JP | 2006-005367 | 1/2006 |
| JP | 2007-05522 | 1/2007 |
| JP | 2007-059864 | 3/2007 |
| JP | 2007-184656 | 7/2007 |
| JP | 2007-305575 | 11/2007 |
| JP | 2008-187030 | 8/2008 |
| WO | 2008/056296 A1 | 5/2008 |
| WO | 2008/078235 A2 | 7/2008 |

OTHER PUBLICATIONS

Translation of International Preliminary Report on Patentability for International Application No. PCT/JP2009/005293, International Filing Date Oct. 9, 2009.

International Search Report for International International Application No. PCT/JP2009/005293, International Filing Date Oct. 9, 2009.

Translation of International Search Report for International International Application No. PCT/JP2009/005293, International Filing Date Oct. 9, 2009.

Written Opinion of the International Searching Authority for International International Application No. PCT/JP2009/005293, International Filing Date Oct. 9, 2009.

Translation of Written Opinion of the International Searching Authority for International International Application No. PCT/JP2009/005293, International Filing Date Oct. 9, 2009.

China Office Action, Jul. 24, 2012, 7 pages.

* cited by examiner

P-P

LIGHT EMITTING MODULE, METHOD OF MANUFACTURING THE LIGHT EMITTING MODULE, AND LAMP UNIT

CROSS-REFERENCES TO RELATED APPLICATIONS

This is a U.S. national phase of PCT/JP2009/005293, filed 9 Oct. 2009, claiming priority from Japanese Application No. JP2008-266754, filed 15 Oct. 2008.

FIELD OF THE INVENTION

The present invention relates to a light emitting module, a method of manufacturing the light emitting module, and a lamp unit comprising the light emitting module.

BACKGROUND ART

In recent years, for the purpose of long life or reduction in power consumption, a technique has been developed in which a light emitting module having a light emitting element, such as an LED (Light Emitting Diode), is adopted as a light source for emitting strong light, such as a lamp unit that emits light toward the front of a vehicle. However, the light emitting module to be used in such an application is required to emit the light with high light intensity. Herein, in order to improve, for example, the extraction efficiency of while light, a lighting system comprising: a light emitting element that mainly emits blue light; a yellow phosphor that mainly emits yellow light by being excited with the blue light; and a blue-transmitting yellow-reflecting means that transmits the blue light from the light emitting element and reflects the light with a wavelength of the yellow light or more from the yellow phosphor, is proposed (see, for example, Patent Document 1).

However, when a wavelength of light is converted by using a normal powdered phosphor, the light intensity of the light is weakened when the light hits the particles of the phosphor, and hence it is difficult to achieve a high use efficiency of light. Accordingly, a structure comprising, for example, a ceramic layer arranged within the channel of the light emitted by a light emitting layer is proposed (see, for example, Patent Document 2).

PATENT DOCUMENTS

[Patent Document 1] Japanese Patent Application Publication No. 2007-59864
[Patent Document 2] Japanese Patent Application Publication No. 2006-5367

DISCLOSURE OF THE INVENTION

Problem to be Solved by the Invention

Because light emitting elements, such as LED, etc., have been recently used as light sources for lamp units to be mounted in vehicles, it becomes an important issue to enhance the luminance of the light emitted by such a light emitting element. Accordingly, development of a new technique is strongly demanded in which the light emitted by a light emitting element has high luminance, as well as the enhancement of the use efficiency of the light emitted thereby.

In view of these situations, the present invention has been made to solve the aforementioned issue, and a purpose of the invention is to provide a light emitting module emitting the light with high luminance.

Means for Solving the Problem

In order to solve the aforementioned issue, a light emitting module according to an embodiment of the present invention comprises: a light emitting element; a light wavelength conversion member configured to convert the wavelength of the light emitted by the light emitting element; and a light guiding member configured to narrow down the emission area of the light that has transmitted the light wavelength conversion member to an area smaller than the light emitting area of the light emitting element. According to the embodiment, the emission area of light can be made small while a decrease in the use efficiency of light is being suppressed, and thereby the luminance of the light can be enhanced.

The light wavelength conversion member may be transparent. According to the embodiment, a decrease in the light intensity, occurring when light is transmitting the inside of the light wavelength conversion member, can be suppressed. Accordingly, the light emitted by the light emitting element can be used efficiently.

The light wavelength conversion member may have 40 percent or more of the total light transmittance of the light with a wavelength within the conversion wavelength range. As a result of the intensive research and development by the inventors, it has been found that, when a light wavelength conversion member is so transparent that the total light transmittance of the light with a wavelength within the conversion wavelength range of the light wavelength conversion member is 40 percent or more, proper conversion of the wavelength of light by the light wavelength conversion member and suppression of a decrease in the light intensity of the light that transmits the light wavelength conversion member can be both satisfied. Therefore, according to the embodiment, it becomes possible to properly convert the wavelength of the light that transmits a light wavelength conversion member while a decrease in the light intensity of the light is being suppressed.

The light guiding member may be provided on the surface of the light wavelength conversion member. According to the embodiment, the light that has been reflected by the light guiding member transmits the inside of the light wavelength conversion member again, and hence the wavelength of the light can be effectively converted.

The light wavelength conversion member may have a tapered surface that faces the incident surface on which the light from the light emitting element is to be incident and that is inclined with respect to the incident surface. The light guiding member may be provided on the tapered surface. According to the embodiment, more of the light that has been incident on the incident surface can be reflected in the directions different from the direction toward the incident surface. Accordingly, a loss of light, occurring before reaching the emission surface, can be reduced and therefore a decrease in the use efficiency of light, occurring due to the narrowing down of the light emitting area, can be suppressed.

The light emitting module according to the present embodiment may further comprise a heat sink provided on the light guiding member. According to the embodiment, release of the thermal energy accumulated in the light wavelength conversion member by the Stokes loss can be prompted. Accordingly, an influence on light emission of the light emitting element by the heat in the light wavelength conversion member can be suppressed.

The light guiding member may guide the light such that the light is emitted in the direction approximately parallel to the light emitting surface of the light emitting element. According to the embodiment, the emission area of light can be narrowed down by a simplified configuration, such as the case where, for example, a low light wavelength conversion member is attached to the light emitting surface to guide the light in the direction approximately parallel to the light emitting surface.

Another embodiment of the present invention is a method of manufacturing a light emitting module. The method comprises: providing, in a light wavelength conversion member for converting the wavelength of the light incident on the incident surface, a light guiding member configured to narrow down the emission area of the light that has transmitted the light wavelength conversion member to an area smaller than the area of the incident surface; and arranging a light emitting element and the light wavelength conversion member such that the light emitted by the light emitting element is incident on the incident surface of the light wavelength conversion member.

According to the embodiment, a light emitting module can be manufactured by a simplified process where a light wavelength conversion member provided with a light guiding member and a light emitting member are properly arranged. Accordingly, a light emitting module can be simply manufactured in comparison with, for example, the case where a light guiding member is provide after a powdered light wavelength conversion member has been mounted above a light emitting element.

Still another embodiment of the present invention is a lamp unit. The lamp unit comprises: a light emitting module including a light emitting element, a light wavelength conversion member configured to convert the wavelength of the light emitted by the light emitting element, and a light guiding member configured to narrow down the emission area of the light that has transmitted the light wavelength conversion member to an area smaller than the light emitting area of the light emitting element; and an optical member configured to collect the light emitted from the light emitting module. According to the embodiment, a lamp unit using a light emitting module that can emit the light with high luminance can be manufactured. Thereby, a lamp unit emitting the light with high luminance can be provided.

Advantage of the Invention

According to the present invention, a light emitting module emitting the light with high luminance can be provided.

REFERENCE NUMERALS

10 AUTOMOTIVE HEADLAMP
34 REFLECTOR
36 BRACKET
38 LIGHT EMITTING MODULE SUBSTRATE
40 LIGHT EMITTING MODULE
44 SUBSTRATE
48 ELEMENT-MOUNTING SUBSTRATE
50 REFLECTIVE SUBSTRATE
52 SEMICONDUCTOR LIGHT EMITTING ELEMENT
56 CERAMIC UNIT
58 LIGHT WAVELENGTH CONVERSION CERAMIC
58A EMISSION SURFACE
58B INCIDENT SURFACE
60 REFLECTIVE FILM

BEST MODE FOR CARRYING OUT THE INVENTION

Preferred embodiments of the present invention will now be described in detail with reference to accompanying drawings.

First Embodiment

Figure 1:
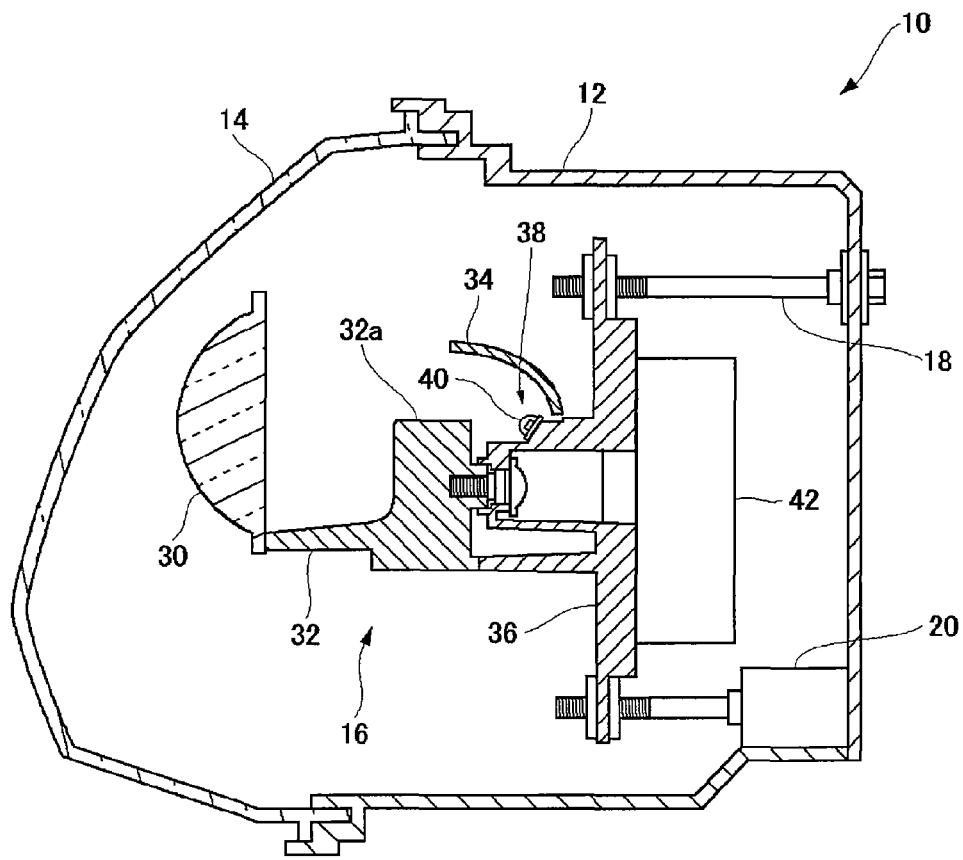
FIG. 1 is a sectional view illustrating the configuration of an automotive headlamp according to a first embodiment.

FIG. 1 is a sectional view illustrating the configuration of an automotive headlamp 10 according to a first embodiment. The automotive headlamp 10 has a lamp body 12, a front cover 14, and a lamp unit 16. Hereinafter, descriptions will be made, assuming that the left side in FIG. 1 is the front of the lamp and the right side therein is the back thereof. In addition, when viewing the front of the lamp, the right side is referred to as the right side of the lamp and the left side as the left side thereof. FIG. 1 illustrates the cross section of the automotive headlamp 10 cut by the vertical plane including the light axis of the lamp unit 16, when viewed from the left side of the lamp. When the automotive headlamp 10 is to be mounted in a vehicle, the automotive headlamps 10, which are formed symmetrically with each other, are provided in the left and right front portions of the vehicle, respectively. FIG. 1 illustrates the configuration of either of the left and right automotive headlamps 10.

The lamp body 12 is formed into a box shape having an opening. The front cover 14 is formed into a bowl shape with a resin having translucency or glass. The front cover 14 is installed such that the edge thereof is attached to the opening of the lamp body 12. In such a manner, a lamp chamber is formed in the area covered with the lamp body 12 and the front cover 14.

The lamp unit 16 is arranged in the lamp chamber. The lamp unit 16 is fixed to the lamp body 12 with aiming screws 18. The aiming screw 18 in the lower portion is configured to be rotatable by an operation of a leveling actuator 20. Accordingly, the light axis of the lamp unit 16 can be moved in the up-down direction by operating the leveling actuator 20.

The lamp unit 16 has a projection lens 30, a support member 32, a reflector 34, a bracket 36, a light emitting module substrate 38, and a radiating fin 42. The projection lens 30 is composed of a plano-convex aspheric lens, the front surface of which is convex-shaped and the back surface of which is flat-shaped, and projects a light source image that is formed on the back focal plane toward the front of the vehicle as an inverted image. The support member 32 supports the projection lens 30. A light emitting module 40 is provided on the light emitting module substrate 38. The reflector 34 reflects the light emitted from the light emitting module 40 to form the light source image on the back focal plane of the projection lens 30. As stated above, the reflector 34 and the projection lens 30 function as optical members that collect the light emitted by the light emitting module 40 toward the front of the lamp. The radiating fin 42 is installed onto the back surface of the bracket 36 to radiate the heat mainly generated by the light emitting module 40.

A shade 32a is formed on the support member 32. The automotive headlamp 10 is used as a light source for low-beam, and the shade 32a forms, in front of the vehicle, a cut-off line in the light distribution pattern for low-beam by shielding part of the light that has been emitted from the light emitting module 40 and reflected by the reflector 34. Because the light distribution pattern for low-beam is publicly known, descriptions thereof will be omitted.

Figure 2:
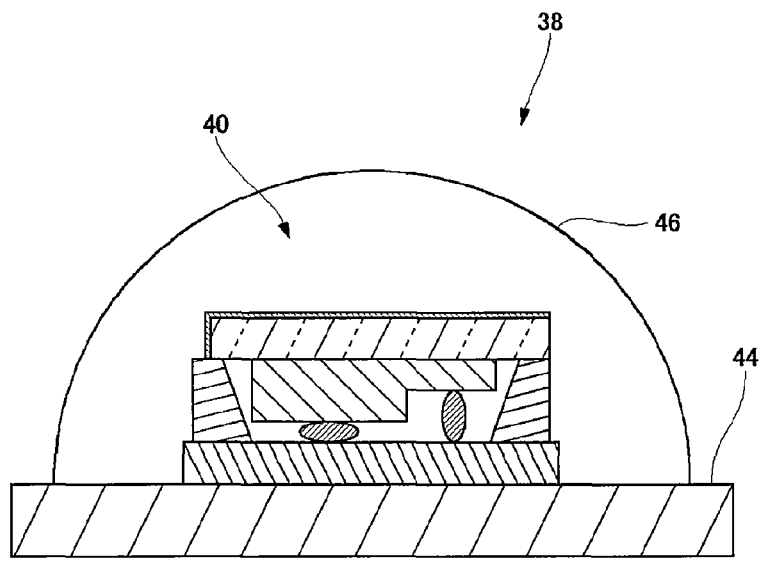
FIG. 2 is a view illustrating the configuration of a light emitting module substrate according to the first embodiment.

FIG. 2 is a view illustrating the configuration of the light emitting module substrate 38 according to the first embodiment. The light emitting module substrate 38 has the light emitting module 40, a substrate 44, and a transparent cover 46. The substrate 44 is a printed circuit board and the light emitting module 40 is attached to the upper surface of the substrate 44. The light emitting module 40 is covered with a colorless transparent cover 46. The light emitting module 40 has a semiconductor light emitting element 52 and light wavelength conversion ceramic 58, which is a light wavelength conversion member. The light wavelength conversion ceramic 58 is mounted on the upper surface of the semiconductor light emitting element 52.

Figure 3:
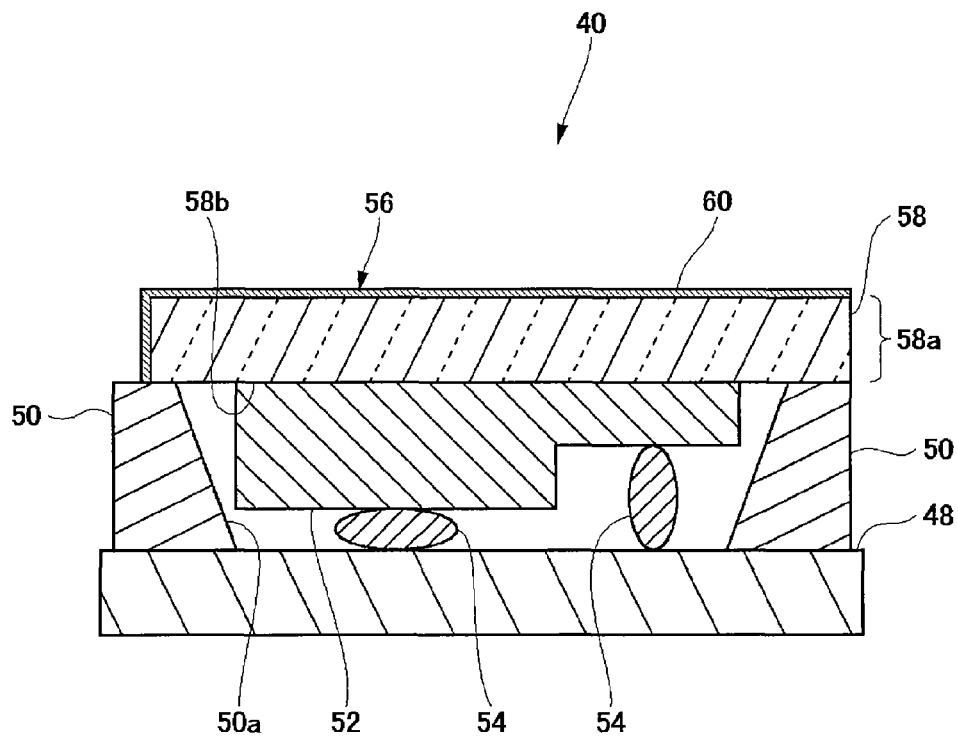
FIG. 3 is a view illustrating the configuration of a light emitting module according to the first embodiment.

FIG. 3 is a view illustrating the configuration of the light emitting module 40 according to the first embodiment. The light emitting module 40 has an element-mounting substrate 48, a reflective substrate 50, the semiconductor light emitting element 52, and a ceramic unit 56.

The element-mounting substrate 48 is formed into a plate shape with a material having high thermal conductivity, such as AlN, SiC, $Al_2O_3$, and Si. The reflective substrate 50 is formed into a shape in which a through-hole 50a is provided at the center of the rectangular parallelepiped shaped member. The inner surface of the through-hole 50a is subjected to mirror finishing in which aluminum or silver is deposited or sputtered thereonto in order to reflect light.

The semiconductor light emitting element 52 is composed of an LED element. In the first embodiment, a blue LED mainly emitting the light with a blue wavelength is adopted as the semiconductor light emitting element 52. Specifically, the semiconductor light emitting element 52 is composed of a GaN LED element that has been formed by subjecting a GaN semiconductor layer to crystal growth on a sapphire substrate. The semiconductor light emitting element 52 is formed as, for example, a square chip having a size of 1 mm×1 mm, and is provided such that the central wavelength of the emitted blue light is 460 nm. It is needless to say that the configuration of the semiconductor light emitting element 52 and the wavelength of the light to be emitted should not be limited to what have been stated above.

The ceramic unit 56 is a light wavelength conversion member and is composed of at least light wavelength conversion ceramic 58 and a reflective film 60. The light wavelength conversion ceramic 58 is formed by dicing the light wavelength conversion ceramic formed into a plate shape having a thickness of 50 μm or more and less than 1000 μm, so that the size thereof is larger than that of the semiconductor light emitting element 52 by 5 percent or more and 10 percent or less. It is needless to say that the size of the light wavelength conversion ceramic 58 should not be limited thereto, and may be diced, for example, so as to have the same size as that of the semiconductor light emitting element 52. Alternatively, the light wavelength conversion ceramic 58 may be diced so as to have a size that is larger than that of the semiconductor light emitting element 52 by more than 10 percent, or by more than 0 and less than 5 percent.

The light wavelength conversion ceramic 58 is so-called light emitting ceramic or fluorescent ceramic, and can be obtained by sintering the ceramic green body made of YAG (Yttrium Aluminum Garnet) powder that is a phosphor to be excited by blue light. Because a method of manufacturing such light wavelength conversion ceramic is publicly known, detailed descriptions thereof will be omitted. Diffusion of light on the surface of the powder of the light wavelength conversion ceramic 58 thus obtained can be suppressed, different from, for example, a powdered phosphor, and thereby a loss of the light emitted by the semiconductor light emitting element 52 is very small.

The light wavelength conversion ceramic 58 converts the wavelength of the blue light mainly emitted by the semiconductor light emitting element 52 then emits yellow light. Accordingly, synthesized light that has been synthesized from both the blue light that has transmitted, as it is, the light wavelength conversion ceramic 58 and the yellow light whose wavelength has been converted by the light wavelength conversion ceramic 58, is emitted from the light emitting module 40. Thus, white light can be emitted from the light emitting module 40.

Transparent ceramic is adopted as the light wavelength conversion ceramic 58. The "to be transparent" in the first embodiment means that the total light transmittance of the light with a wavelength within the conversion wavelength range is 40 percent or more. As a result of the intensive research and development by the inventors, it has been found that, when the light wavelength conversion ceramic 58 is so transparent that the total light transmittance of the light with a wavelength within the conversion wavelength range is 40 percent or more, the wavelength of light can be properly converted by the light wavelength conversion ceramic 58 and a decrease in the light intensity of the light that is transmitting the light wavelength conversion ceramic 58 can also be properly suppressed. Accordingly, the light emitted by the semiconductor light emitting element 52 can be efficiently converted by making the light wavelength conversion ceramic 58 transparent as stated above.

The light wavelength conversion ceramic 58 is composed of an inorganic substance without binder such that the durability thereof is enhanced in comparison with the case where an organic substance, such as binder, is included. Accordingly, it becomes possible to supply the power of, for example, 1 W or more to the light emitting module 40, and thereby the luminance and light intensity of the light emitted by the light emitting module 40 can be enhanced.

Alternatively, a semiconductor light emitting element mainly emitting the light with a wavelength other than blue may be adopted as the semiconductor light emitting element 52. In this case, light wavelength conversion ceramic for converting the wavelength of the light mainly emitted by the semiconductor light emitting element 52 is also adopted as the light wavelength conversion ceramic 58. Also, in this case, the light wavelength conversion ceramic 58 may convert the wavelength of the light emitted by the semiconductor light emitting element 52 such that the light with a wavelength of white or close to white is emitted by combining with the light with the wavelength mainly emitted by the semiconductor light emitting element 52.

The reflective film 60 is formed by masking one of both surfaces and one of four end surfaces of the light wavelength conversion ceramic 58 and then by making a thin film of aluminum, silver, or the like, with deposition or sputtering. When the light wavelength conversion ceramic 58 is masked as stated above, one surface on which the reflective film 60 has not been formed becomes the incident surface 58b on which light is to be incident, and one end surface on which the reflective film 60 has not been formed becomes the emission surface 58a from which light is to be emitted. In the first embodiment, the plate-shaped light wavelength conversion ceramic 58 is adopted, and hence the reflective film 60 can be easily formed.

When the light emitting module 40 is to be manufactured, the reflective substrate 50 is first fixed to the element-mounting substrate 48 by adhesion, etc. Subsequently, the semiconductor light emitting element 52 is arranged within the through-hole 50a of the reflective substrate 50 such that the light emitting surface thereof is located upward, and then flip-chip implementation is performed by bonding to the element-mounting substrate 48 through gold bumps 54. In this case, the semiconductor light emitting element 52 is arranged such that the light emitting surface thereof, which is the upper surface thereof, is located at the same height as the upper surface of the reflective substrate 50, or at a slightly lower height than it.

Subsequently, the ceramic unit 56 is arranged above the semiconductor light emitting element 52 such that the incident surface 58b of the light wavelength conversion ceramic 58 faces the light emitting surface of the semiconductor light emitting element 52, and then fixed, by adhesion, to the semiconductor light emitting element 52 and the upper surface of the reflective substrate 50. In the case, a material excellent in light resistance, such as a silicone system, sol-gel silica system, fluorine system, inorganic glass system, or the like, is used as the adhesive. Because the plate-shaped light wavelength conversion ceramic 58 is used in the first embodiment, the light emitting module 40 can be simply manufactured in comparison with, for example, the case where a powdered light wavelength conversion member is mounted above the semiconductor light emitting element 52.

Thus, the semiconductor light emitting element 52 and the light wavelength conversion ceramic 58 are arranged such that the light emitted by the semiconductor light emitting element 52 is incident on the incident surface of the light wavelength conversion ceramic 58. A method of fixing the ceramic unit 56 is not limited to adhesion, but a mechanical fastening method, for example, such as soldering, caulking, welding, screw cramp, or the like, may be adopted.

In the light emitting module 40 thus manufactured, the emission surface 58a of the light wavelength conversion ceramic 58 is the only one surface of the surfaces of the light wavelength conversion ceramic 58, the surface being exposed outside and no reflective film 60 being formed thereon. The reflective film 60 formed on the surface of the light wavelength conversion ceramic 58 functions as a light guiding member for guiding the light emitted by the semiconductor light emitting element 52, and emits the light from the emission surface 58a by guiding the light in the direction approximately parallel to the light emitting surface of the semiconductor light emitting element 52. The area of the emission surface 58a is smaller than that of the light emitting surface of the semiconductor light emitting element 52. As stated above, the reflective film 60 narrows down the emission area of the light that has transmitted the light wavelength conversion ceramic 58 to an area smaller than the light emitting area of the semiconductor light emitting element 52. Thereby, the luminance of the light emitted from the light emitting module 40 can be enhanced.

Second Embodiment

Figure 4:
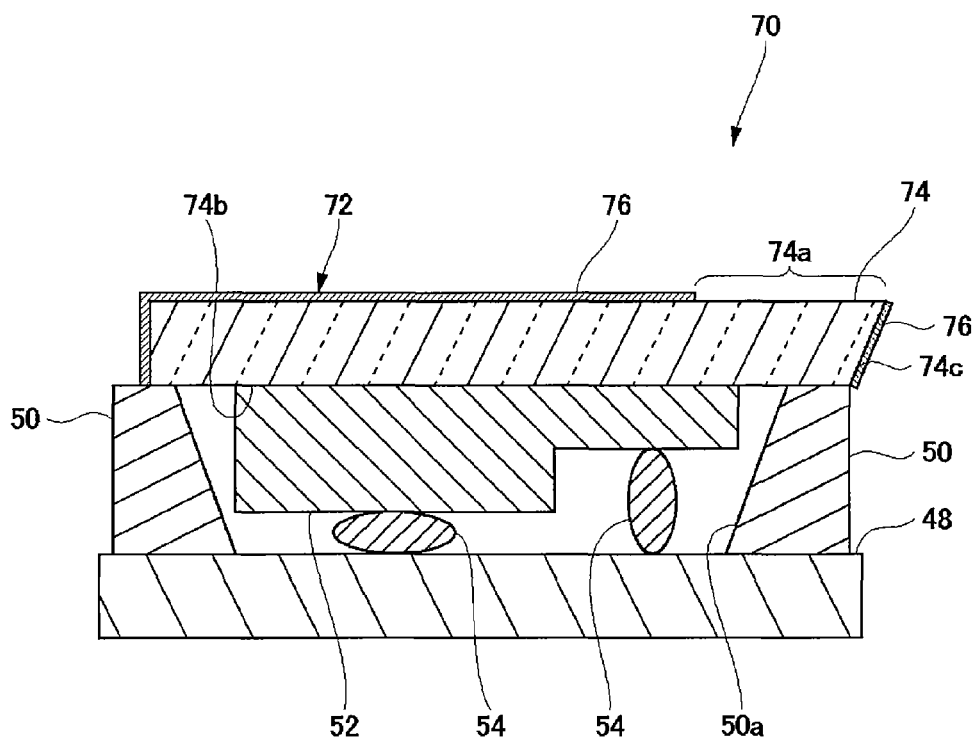
FIG. 4 is a view illustrating the configuration of a light emitting module according to a second embodiment.

FIG. 4 is a view illustrating the configuration of a light emitting module 70 according to a second embodiment. Unless particularly referred to, the configuration of an automotive headlamp in which the light emitting module 70 is mounted is the same as that in the first embodiment, except that the light emitting module 70 is provided instead of the light emitting module 40. The direction into which light is emitted in the light emitting module 70 is different from that in the light emitting module 40. Accordingly, the shape of the part in the bracket 36, where the light emitting module 70 is attached, is different from that in the first embodiment. Hereinafter, the parts similar to those in the first embodiment will be denoted with the same reference numerals and descriptions thereof will be omitted.

The configuration of the light emitting module 70 is the same as that of the aforementioned light emitting module 40, except that a ceramic unit 72 is provided instead of the ceramic unit 56. The ceramic unit 72 has light wavelength conversion ceramic 74, which is a light wavelength conversion member, and a reflective film 76.

The material of the light wavelength conversion ceramic 74 is the same as that of the aforementioned light wavelength conversion ceramic 58. The light wavelength conversion ceramic 74 is formed by dicing the light wavelength conversion ceramic formed into a plate shape having a thickness of 50 μm or more and less than 1000 μm, so that the size thereof is larger than that of the semiconductor light emitting element 52 by 5 percent or more and 10 percent or less. At the time, the light wavelength conversion ceramic 74 is diced such that a tapered surface 74c is formed on one end surface. Alternatively, the light wavelength conversion ceramic may be formed such that the tapered surface 74c is formed on one end surface before being diced. The tapered surface 74c is provided so as to have an angle of 10 degrees or more and less than 75 degrees with respect to the direction perpendicular to the incident surface 74b.

The reflective film 76 is formed by masking, of both surfaces of the light wavelength conversion ceramic 74, the whole region of the surface on the side where the area of the surface becomes small by providing the tapered surface 74c and part of the surface opposite to the above surface, the part of the surface being located along the tapered surface 74c, and then by making a thin film of aluminum, silver, or the like, with deposition or sputtering. In the case, the surface whose whole region is masked becomes the incident surface 74b on which light is to be incident, and the masked part on the opposite surface becomes the emission surface 74a from which light is to be emitted.

When the light emitting module 70 is to be manufactured, the ceramic unit 72 is arranged above the semiconductor light emitting element 52 such that the incident surface 74b of the light wavelength conversion ceramic 74 faces the light emitting surface of the semiconductor light emitting element 52, and then the ceramic unit 72 is adhered and fixed to the semiconductor light emitting element 52 and the upper surface of the reflective substrate 50 by the same adhesion method as described above.

In the light emitting module 70 thus manufactured, the emission surface 74a of the light wavelength conversion ceramic 74 is the only one surface of the surfaces of the light wavelength conversion ceramic 74, the surface being exposed outside and no reflective film 76 being formed thereon. The reflective film 76 formed on the surface of the light wavelength conversion ceramic 74 functions as a light guiding member for guiding the light emitted by the semiconductor light emitting element 52, and emits the light from the emission surface 74a by guiding the light in the direction approximately parallel to the light emitting surface of the semiconductor light emitting element 52. The reflective film 76 is formed such that the area of the emission surface 74a is smaller than that of the light emitting surface of the semiconductor light emitting element 52. As stated above, the reflective film 76 also narrows down the emission area of the light that has transmitted the light wavelength conversion ceramic 74 to an area smaller than the light emitting area of the semiconductor light emitting element 52. Thereby, the luminance of the light emitted from the light emitting module 70 can be enhanced.

Third Embodiment

Figure 5:
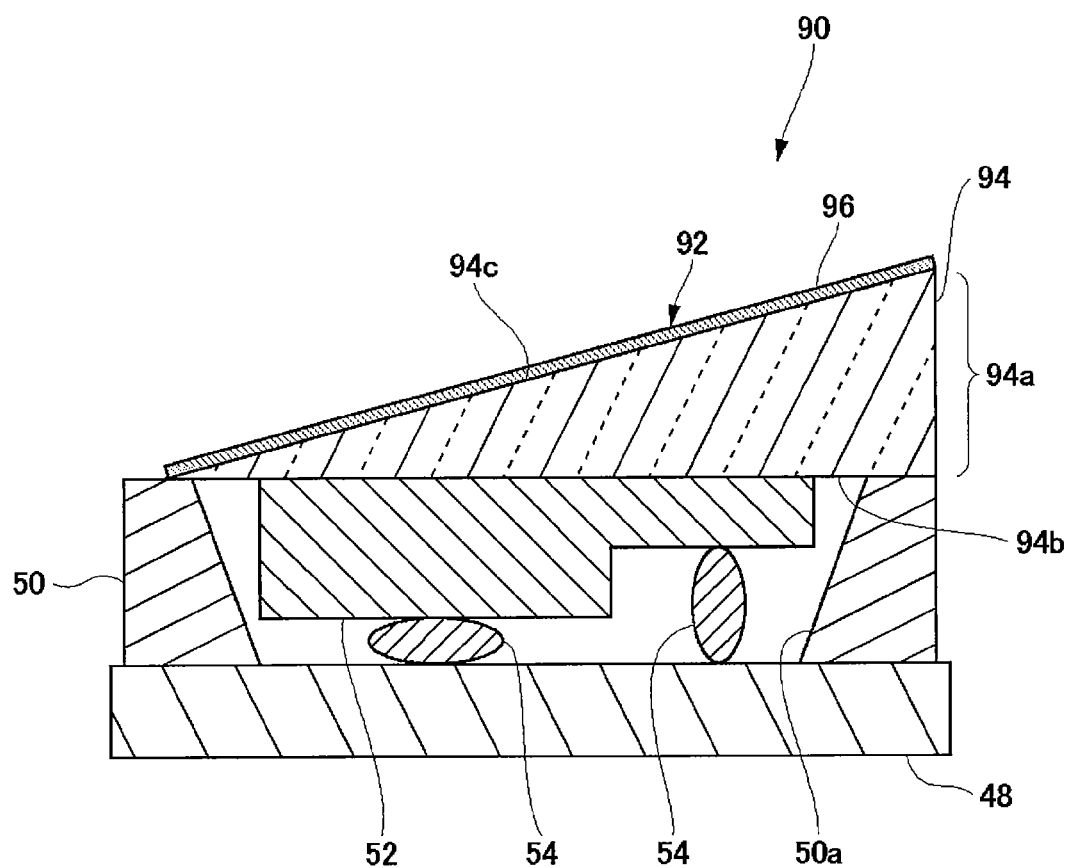
FIG. 5 is a view illustrating the configuration of a light emitting module according to a third embodiment.

FIG. 5 is a view illustrating the configuration of a light emitting module 90 according to a third embodiment. The configuration of the automotive headlamp 10 is the same as that in the first embodiment, except that the light emitting module 90 is provided instead of the light emitting module 40. Hereinafter, the parts similar to those in the first embodiment will be denoted with the same reference numerals and descriptions thereof will be omitted.

The configuration of the light emitting module 90 is the same as that of the aforementioned light emitting module 40, except that a ceramic unit 92 is provided instead of the ceramic unit 56. The ceramic unit 92 has light wavelength conversion ceramic 94, which is a light wavelength conversion member, and a reflective film 96.

The light wavelength conversion ceramic 94 is formed into a triangular pole having a prism shape whose cross section is a triangle in which one of the two sides intersecting each other at right angles (hereinafter, referred to as a "first side") has a length of 50 μm or more and less than 1000 μm. Also, the light wavelength conversion ceramic 94 is formed such that the size of the surface of the light wavelength conversion ceramic 74, the surface including the other side (hereinafter referred to as a "second side") intersecting the first side at right angles on the triangle cross section, is larger than that of the semiconductor light emitting element 52 by 5 percent or more and 10 percent or less. The material of the light wavelength conversion ceramic 94 is the same as that of the aforementioned light wavelength conversion ceramic 58. The surface including the side other than the first and second sides (hereinafter, referred to as a "third side") becomes a tapered surface 94c. Alternatively, the light wavelength conversion ceramic 94 may be formed by dicing the periphery of a tapered surface 94c that has been provided by shaving one surface of the light wavelength conversion ceramic formed into a palate shape having a thickness of 50 μm or more and less than 1000 μm.

The reflective film 96 is formed by masking the surface of the light wavelength conversion ceramic 94 including the first side and the surface thereof including the second side, and then by making a thin film of aluminum, silver, or the like, with deposition or sputtering. In the ceramic unit 92 thus manufactured, the surface of the light wavelength conversion ceramic 94 including the first side becomes the emission surface 94a and the surface thereof including the second side becomes the incident surface 94b.

Accordingly, the tapered surface 94c faces each of the emission surface 94a and the incident surface 94b and is inclined with respect to each of them. In the third embodiment, the second side of the light wavelength conversion ceramic 94 is made longer than the first side. Therefore, the tapered surface 94c is inclined at an angle less than 45 degrees with respect to the incident surface 94b, while is inclined at an angle more than 45 degrees with respect to the emission surface 94a. The light wavelength conversion ceramic 94 should not be limited to one in which the emission surface 94a and the incident surface 94b intersect each other at right angles, but light wavelength conversion ceramic in which, for example, the emission surface 94a is inclined at an angle less than 90 degrees with respect to the incident surface 94b may be adopted, or light wavelength conversion ceramic in which, for example, the emission surface 94a is inclined at an angle more than 90 degrees with respect to the incident surface 94b may be adopted.

When the light emitting module 90 is to be manufactured, the ceramic unit 92 is arranged above the semiconductor light emitting element 52 such that the incident surface 94b of the light wavelength conversion ceramic 94 faces the light emitting surface of the semiconductor light emitting element 52, and then the ceramic unit 92 is adhered and fixed to the semiconductor light emitting element 52 and the upper surface of the reflective substrate 50 by the same adhesion method as stated above.

In the light emitting module 90 thus manufactured, the emission surface 94a of the light wavelength conversion ceramic 94 is the only one surface of the surfaces of the light wavelength conversion ceramic 94, the surface being exposed outside and no reflective film 96 being formed thereon. The reflective film 96 formed on the surface of the light wavelength conversion ceramic 94 functions as a light guiding member for guiding the light emitted by the semiconductor light emitting element 52, and emits the light from the emission surface 94a by guiding the light in the direction approximately parallel to the light emitting surface of the semiconductor light emitting element 52. The reflective film 96 is formed such that the area of the emission surface 94a is smaller than that of the light emitting surface of the semiconductor light emitting element 52. As stated above, the reflective film 96 also narrows down the emission area of the light that has transmitted the light wavelength conversion ceramic 94 to an area smaller than the light emitting area of the semiconductor light emitting element 52, also in the third embodiment. Thereby, the luminance of the light emitted from the light emitting module 90 can be enhanced.

Fourth Embodiment

Figure 6:
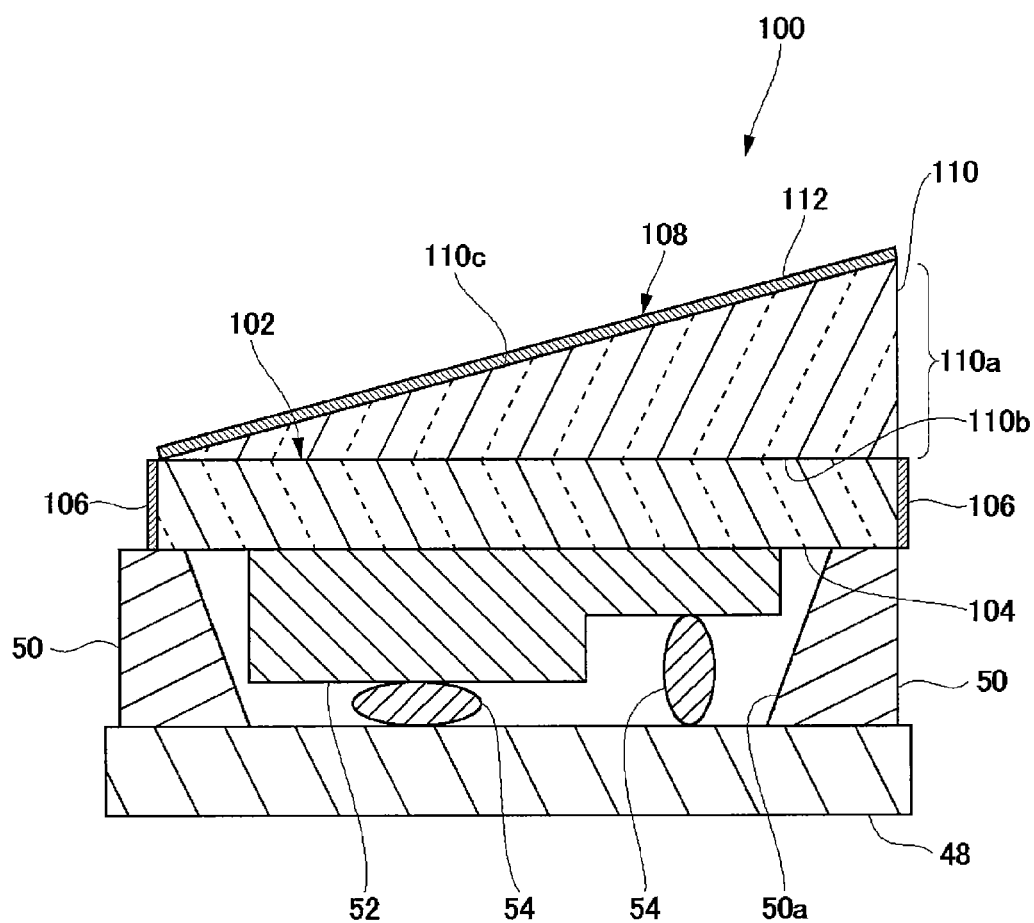
FIG. 6 is a view illustrating the configuration of a light emitting module according to a fourth embodiment.

FIG. 6 is a view illustrating the configuration of a light emitting module 100 according to a fourth embodiment. The configuration of the automotive headlamp 10 is the same as that in the first embodiment, except that the light emitting module 100 is provided instead of the light emitting module 40. Hereinafter, the parts similar to those in the first embodiment will be denoted with the same reference numerals and descriptions thereof will be omitted.

The configuration of the light emitting module 100 is the same as that of the aforementioned light emitting module 40, except that a first ceramic unit 102 and a second ceramic unit 108 are provided instead of the ceramic unit 56. The first ceramic unit 102 has light wavelength conversion ceramic 104, which is a light wavelength conversion member, and a reflective film 106.

The light wavelength conversion ceramic 104 is formed by dicing the light wavelength conversion ceramic formed into a plate shape having a thickness of 50 μm or more and less than 1000 μm, so that the size thereof is larger than that of the semiconductor light emitting element 52 by 5 percent or more and 10 percent or less. The material of the light wavelength conversion ceramic 104 is the same as that of the aforementioned light wavelength conversion ceramic 58. The reflective film 106 is formed by masking both surfaces of the light wavelength conversion ceramic 104 and then by making a thin film of aluminum, silver, or the like, with deposition or sputtering. Thereby, the reflective film 106 is formed on the end surfaces across the whole circumference of the light wavelength conversion ceramic 104.

The second ceramic unit 108 has transparent ceramic 110 and a reflective film 112. The transparent ceramic 110 is formed into a triangular pole having a prism shape whose cross section is a triangle in which one of the two sides intersecting each other at right angles (hereinafter, referred to as a "first side") has a length of 50 μm or more and less than 1000 μm. Also, the transparent ceramic 110 is formed such that the size of the surface of the transparent ceramic 110, the surface including the other side (hereinafter referred to as a "second side") intersecting the first side at right angles on the triangle cross section, is larger than that of the semiconductor light emitting element 52 by 5 percent or more and 10 percent or less. The surface including the side other than the first and second sides (hereinafter, referred to as a "third side") becomes a tapered surface 110c.

The transparent ceramic 110 is composed of colorless and transparent ceramic in which a light emitting element, such as phosphor, etc., is not doped. The reason why ceramic is adopted is because the ceramic has the same refraction index as the light wavelength conversion ceramic 104 and thereby a decrease in the light intensity, occurring on the joint surface with the light wavelength conversion ceramic 104, can be suppressed. Alternatively, a transparent material other than ceramic may be adopted. In addition, the transparent ceramic 110 may be formed by dicing the periphery of a tapered surface 110c that has been provided by shaving one surface of the transparent ceramic formed into a plate shape having a thickness of 50 μm or more and less than 1000 μm.

The reflective film 112 is formed by masking the surface of the transparent ceramic 110 including the first side and the surface thereof including the second side, and then by making a thin film of aluminum, silver, or the like, with deposition or sputtering. In the ceramic unit 108 thus manufactured, the surface of the transparent ceramic 110 including the first side becomes the emission surface 110a and the surface thereof including the second side becomes the incident surface 110b.

Accordingly, the tapered surface 110c faces each of the emission surface 110a and the incident surface 110b and is inclined with respect to each of them. In the fourth embodiment, the second side of the transparent ceramic 110 is made longer than the first side. Therefore, the tapered surface 110c is inclined at an angle less than 45 degrees with respect to the incident surface 110b, while is inclined at an angle more than 45 degrees with respect to the emission surface 110a. The transparent ceramic 110 should not be limited to one in which the emission surface 110a and the incident surface 110b intersect each other at right angles, but transparent ceramic in which, for example, the emission surface 110a is inclined at an angle less than 90 degrees with respect to the incident surface 110b may be adopted, or transparent ceramic in which, for example, the emission surface 110a is inclined at an angle more than 90 degrees with respect to the incident surface 110b may be adopted.

When the light emitting module 100 is to be manufactured, the first ceramic unit 102 is first arranged above the semiconductor light emitting element 52 such that one surface of the light wavelength conversion ceramic 104 faces the light emitting surface of the semiconductor light emitting element 52, and then the first ceramic unit 102 is adhered and fixed to the semiconductor light emitting element 52 and the upper surface of the reflective substrate 50 by the same adhesion method as described above. Subsequently, the second ceramic unit 108 is arranged above the first ceramic unit 102 such that the incident surface 110b of the transparent ceramic 110 faces the other surface of the light wavelength conversion ceramic 104, and then the incident surface 110b of the transparent ceramic 110 is adhered and fixed to the upper surface of the light wavelength conversion ceramic 104 by the same method as described above.

In the light emitting module 100 thus manufactured, the emission surface 110a of the transparent ceramic 110 is the only one surface of the surfaces of the transparent ceramic 110, the surface being exposed outside and no reflective film 112 being formed thereon. The reflective film 112 formed on the surface of the transparent ceramic 110 functions as a light guiding member for guiding the light emitted by the semiconductor light emitting element 52, and emits the light from the emission surface 110a by guiding the light in the direction approximately parallel to the light emitting surface of the semiconductor light emitting element 52. The reflective film 112 is formed such that the area of the emission surface 110a is smaller than that of the light emitting surface of the semiconductor light emitting element 52. As stated above, the reflective film 112 also narrows down the emission area of the light that has transmitted the light wavelength conversion ceramic 104 to an area smaller than the light emitting area of the semiconductor light emitting element 52 in the fourth embodiment. Thereby, the luminance of the light emitted from the light emitting module 100 can be enhanced.

Fifth Embodiment

Figure 7:
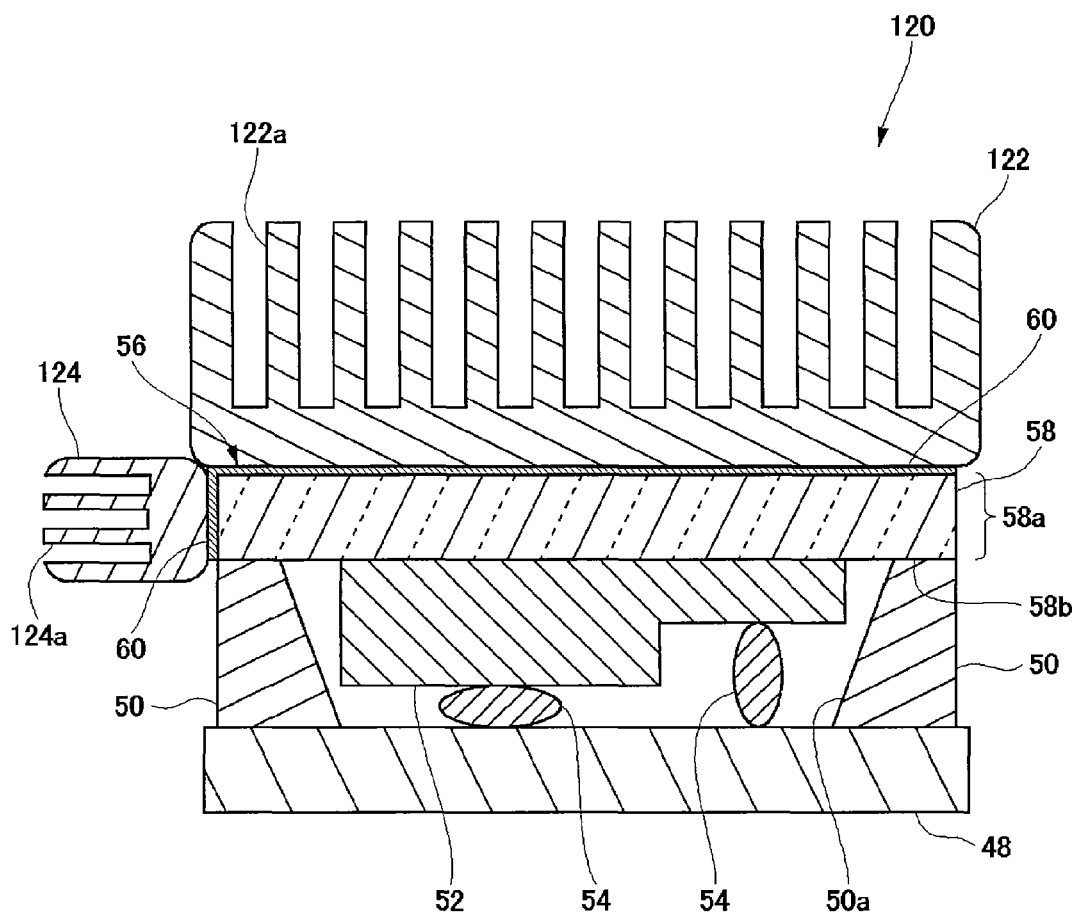
FIG. 7 is a view illustrating the configuration of a light emitting module according to a fifth embodiment.

FIG. 7 is a view illustrating the configuration of a light emitting module 120 according to a fifth embodiment. The configuration of the automotive headlamp 10 is the same as that in the first embodiment, except that the light emitting module 120 is provided instead of the light emitting module 40. Hereinafter, the parts similar to those in the first embodiment will be denoted with the same reference numerals and descriptions thereof will be omitted.

The light emitting module 120 is configured in the same way as the light emitting module 40, except that heat sinks 122 and 124 are provided. The heat sink 122 is formed of a material excellent in thermal conductivity, such as carbon, copper, aluminum, or the like, and has many fins 122a. The surface of the heat sink 122 where the fins 122a are not provided is adhered to the reflective film 60 formed on one surface of the light wavelength conversion ceramic 58, and thereby being fixed to the ceramic unit 56.

The heat sink 124 is also formed of a material excellent in thermal conductivity, such as carbon, copper, aluminum, or the like, and has many fins 124a. The surface of the heat sink 124 where the fins 124a are not provided is adhered to the reflective film 60 formed on the end surface of the light wavelength conversion ceramic 58, and thereby being fixed to the ceramic unit 56.

Although FIG. 7 only illustrates the heat sink 124 fixed to the reflective film 60 formed on one end surface of the light wavelength conversion ceramic 58, heat sinks (not illustrated), which are formed in the same way as the heat sink 124, are also adhered to the remaining two end surfaces where the reflective films 60 are formed, and thereby being fixed to the ceramic unit 56.

The phosphor contained in the light wavelength conversion ceramic 58 converts the light with a wavelength within a specific range into the light with a wavelength longer than the above wavelength. Light has higher energy as the wavelength thereof is shorter. Accordingly, when the light with a short wavelength is converted into one with such a longer wavelength, thermal energy corresponding to a difference in the energy, i.e., to the Stokes loss is accumulated in the light wavelength conversion ceramic 58. On the other hand, when the temperature of the light wavelength conversion ceramic 58 becomes high, the lattice vibration of the crystal that forms the light wavelength conversion ceramic 58 becomes large, and hence the energy is not effectively transmitted to the luminescence center element, thereby the luminous efficiency of the light wavelength conversion ceramic 58 being decreased. Accordingly, it becomes very important to suppress an increase in the temperature of the light wavelength conversion ceramic 58 in order to achieve a high luminous efficiency by the light wavelength conversion ceramic 58.

The heat generated in the light wavelength conversion ceramic 58 can be easily released outside by providing the heat sinks 122 and 124 as stated above, and thereby an increase in the temperature of the light wavelength conversion ceramic 58 can be suppressed. In the fifth embodiment, the case where the heat sinks 122 and 124 are provided in the light emitting module 40 according to the first embodiment has been described; however, it is needless to say that a heat sink may be provided in any one of the light emitting modules according to the second through fourth embodiments.

Sixth Embodiment

Figure 8:
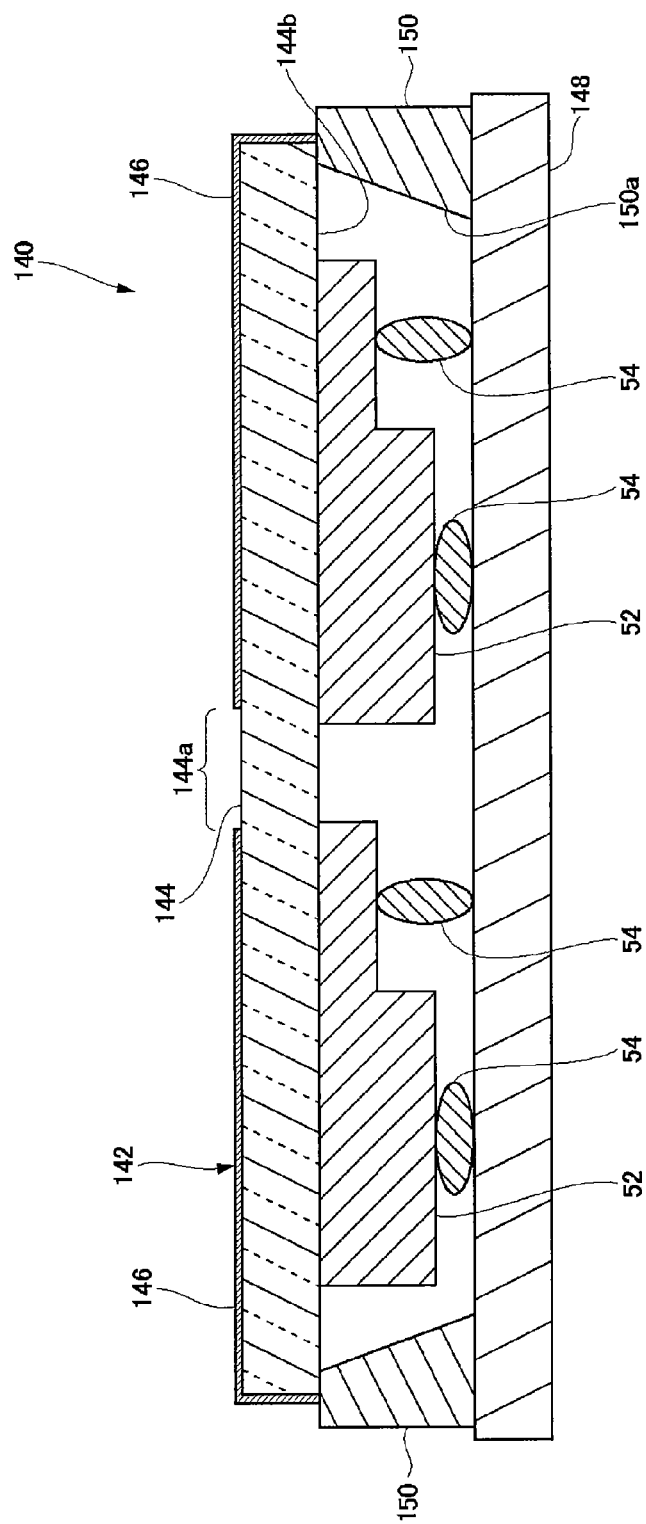
FIG. 8 is a view illustrating the configuration of a light emitting module according to a sixth embodiment.

FIG. 8 is a view illustrating the configuration of a light emitting module 140 according to a sixth embodiment. Unless particularly referred to, the configuration of an automotive headlamp in which the light emitting module 40 is mounted is the same as that in the first embodiment, except that the light emitting module 140 is provided instead of the light emitting module 40. The direction into which light is emitted in the light emitting module 140 is different from that in the light emitting module 40. Accordingly, the shape of the part in the bracket 36, where the light emitting module 140 is attached, is different from that in the first embodiment. Hereinafter, the parts similar to those in the first embodiment will be denoted with the same reference numerals and descriptions thereof will be omitted.

The light emitting module 140 has an element-mounting substrate 148, a reflective substrate 150, the semiconductor light emitting element 52, and a ceramic unit 142. The element-mounting substrate 148 is the same as the element-mounting substrate 48 in material and thickness, etc., except that the substrate 148 is formed so as to have a larger area than that of the aforementioned element-mounting substrate 48. The reflective substrate 150 is the same as the reflective substrate 50 in material and thickness, etc., except that the reflective substrate 150 is formed so as to have a larger area than that of the aforementioned reflective substrate 50. A through-hole 150a is also provided at the center of the reflective substrate 150, and the inner surface of the through-hole 150a is subjected to mirror finishing. The light emitting module 140 has two semiconductor light emitting elements 52. Alternatively, three or more of the semiconductor light emitting elements 52 may be provided.

The ceramic unit 142 has light wavelength conversion ceramic 144, which is a light wavelength conversion member, and a reflective film 146. The material of the light wavelength conversion ceramic 144 is the same as that of the aforementioned light wavelength conversion ceramic 58. The light wavelength conversion ceramic 74 is formed by dicing the light wavelength conversion ceramic formed into a plate shape having a thickness of 50 μm or more and less than 1000 μm, so that the size thereof is larger than the total of the light emitting areas of the two semiconductor light emitting elements 52 by 5 percent or more and 10 percent or less.

The reflective film 146 is formed by masking the whole region of one surface of the light wavelength conversion ceramic 144 and part region at the center of the surface opposite to the above surface, and then by making a thin film of aluminum, silver, or the like, with deposition or sputtering. In the case, the surface whose whole region is masked becomes the incident surface 144b on which light is to be incident, and the masked part on the opposite surface becomes the emission surface 144a from which light is to be emitted.

When the light emitting module 140 is to be manufactured, the reflective substrate 150 is first fixed to the element-mounting substrate 148 by adhesion, etc. Subsequently, the two semiconductor light emitting elements 52 are arranged in the horizontal direction and within the through-hole 150a of the reflective substrate 150 such that the light emitting surfaces thereof are located upward, and then flip-chip implementation is performed by bonding to the element-mounting substrate 48 through gold bumps 54. In this case, the semiconductor light emitting element 52 is arranged such that the light emitting surface thereof, which is the upper surface thereof, is located at the same height as the upper surface of the reflective substrate 150, or at a slightly lower height than it.

Subsequently, the ceramic unit 142 is arranged above the semiconductor light emitting element 52 such that the incident surface 144b of the light wavelength conversion ceramic 144 faces the light emitting surface of the semiconductor light emitting element 52, and then fixed, by adhesion, to the semiconductor light emitting element 52 and the upper surface of the reflective substrate 150. An adhesion method at the time is the same as stated above.

In this case, the emission surface 144a of the light wavelength conversion ceramic 144 is the only one surface of the surfaces of the light wavelength conversion ceramic 144, the surface being exposed outside and no reflective film 146 being formed thereon. The reflective film 146 formed on the surface of the light wavelength conversion ceramic 144 functions as a light guiding member for guiding the light emitted by the semiconductor light emitting element 52, and emits the light from the emission surface 144a by guiding the light in the direction approximately parallel to the light emitting surface of the semiconductor light emitting element 52. The area of the emission surface 144a is smaller than the total of the light emitting surfaces of the two semiconductor light emitting elements 52. As stated above, the reflective film 146 narrows down the emission area of the light that has transmitted the light wavelength conversion ceramic 144 to an area smaller than the light emitting area of the semiconductor light emitting element 52. Thereby, the luminance of the light emitted from the light emitting module 140 can be enhanced.

Seventh Embodiment

Figure 9A:
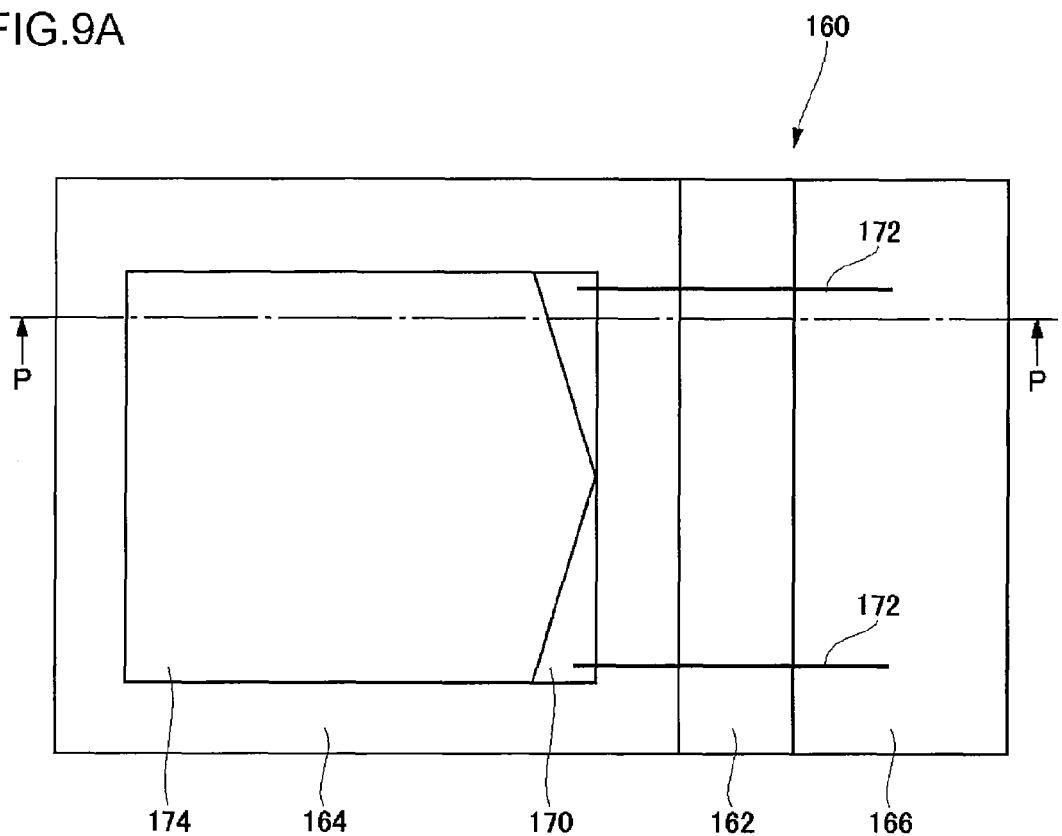
FIG. 9(a) is a top view of a light emitting module according to a seventh embodiment.
Figure 9B:
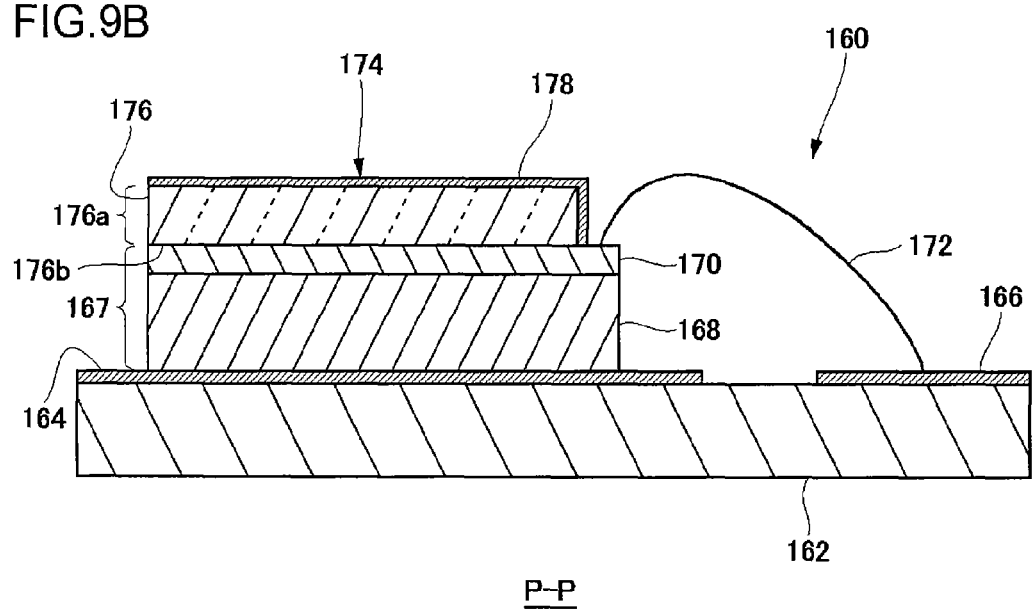
FIG. 9(b) is a sectional view thereof, taken along line P-P of FIG. 9(a).

FIG. 9(a) is a top view of a light emitting module 160 according to a seventh embodiment; and FIG. 9(b) is a sectional view thereof, taken along line P-P of FIG. 9(a). The configuration of the automotive headlamp 10 is the same as that in the first embodiment, except that the light emitting module 160 is provided instead of the light emitting module 40. Hereinafter, the configuration of the light emitting module 160 will be described with reference to FIGS. 9 (*a*) and 9 (*b*). The parts similar to those in the first embodiment will be denoted with the same reference numerals and descriptions thereof will be omitted.

The light emitting module 160 comprises an element-mounting substrate 162, a semiconductor light emitting element 167, and a ceramic unit 174. The element-mounting substrate 162 is formed into a plate shape with the same material as that of the aforementioned element-mounting substrate 48. Electrode patterns 164 and 166 are mounted on the upper surface of the element-mounting substrate 162.

The semiconductor light emitting element 167 has a conductive substrate 168 and a light emitting layer 170. A blue LED element for mainly emitting the light with a blue wavelength is adopted in the semiconductor light emitting element 167. Accordingly, in order to emit the light with a blue wavelength, the light emitting layer 170 is composed of a GaN LED element that has been formed by subjecting a GaN semiconductor layer to crystal growth on a sapphire substrate. The light emitting layer 170 is formed as, for example, a square chip having a size of 1 mm×1 mm, and is provided such that the central wavelength of the emitted blue light is 460 nm.

The light emitting layer 170 is attached to the conductive substrate 168 by adhesion, etc. A p-type semiconductor layer (not illustrated) is provided between the conductive substrate 168 and the light emitting layer 170, while an n-type semiconductor layer (not illustrated) is provided so as to cover the whole upper surface of the light emitting layer 170.

The semiconductor light emitting element 167 is mounted on the upper surface of the electrode pattern 164 by conductive adhesive, such as silver paste, etc., or by gold-tin solder, etc. An electrode (not illustrated) is provided on the upper surface of the semiconductor light emitting element 167, and one end of a gold wire 172 is bonded to the electrode and the other end thereof is bonded to the electrode pattern 166. Thus, the light emitting element 167 is mounted on the upper surface of the element-mounting substrate 162.

The ceramic unit 174 has light wavelength conversion ceramic 176, which is a light wavelength conversion member, and a reflective film 178. The material of the light wavelength conversion ceramic 176 is the same as that of the aforementioned light wavelength conversion ceramic 58. The light wavelength conversion ceramic 176 is formed by dicing the light wavelength conversion ceramic formed into a plate shape having a thickness of 50 μm or more and less than 1000 μm into a home-plate-shaped pentagon created by two corners of the tetragon with the same size as that of the upper surface of the light emitting layer 170 being cut with diagonal lines. Alternatively, the two corners may be cut with curved lines. The electrode provided on the semiconductor light emitting element, to which a gold wire is to be bonded, is mounted so as to be located at the cut portion.

The reflective film 178 is formed by masking the whole region of one surface of the light wavelength conversion ceramic 176 and one end surface including the side that faces the diagonally-cut side, and then by making a thin film of aluminum, silver, or the like, with deposition or sputtering. In the case, the surface whose whole region is masked becomes the incident surface 176*b* on which light is to be incident, and the masked one end surface becomes the emission surface 176*a* from which light is to be emitted.

In the ceramic unit 174 thus provided, the emission surface 176*a* of the light wavelength conversion ceramic 176 is the only one surface of the surfaces of the light wavelength conversion ceramic 176, the surface being exposed outside and no reflective film 178 being formed thereon. The reflective film 178 formed on the surface of the light wavelength conversion ceramic 176 emits light from the emission surface 176*a* by guiding the light in the direction approximately parallel to the light emitting layer 170. The reflective film 178 is formed such that the area of the emission surface 176*a* is smaller than that of the upper surface of the light emitting layer 170. As stated above, the reflective film 178 narrows down the emission area of the light that has transmitted the light wavelength conversion ceramic 176 to an area smaller than the light emitting area of the light emitting layer 170. Thereby, the luminance of the light emitted from the light emitting module 160 can be enhanced.

The present invention should not be limited to the above embodiments, and variations in which each component of the embodiments is appropriately combined are also effective as embodiments of the invention. Various modifications, such as design modifications, can be made with respect to the above embodiments based on the knowledge of those skilled in the art. Such modified embodiments can also fall in the scope of the invention.

In a variation, an optical filter is provided between a semiconductor light emitting element and light wavelength conversion ceramic. The optical filter transmits the blue light mainly emitted by the semiconductor light emitting element. In addition, the optical filter reflects the yellow light mainly emitted by the light wavelength conversion ceramic that converts the wavelength of the blue light. Most of the light emitted by the light emitting element can be first emitted to the light wavelength conversion ceramic by arranging the optical filter between the semiconductor light emitting element and the light wavelength conversion ceramic. Further, the light with a yellow wavelength travelling toward the semiconductor light emitting element, occurring due to the diffusion of light when the wavelength of the light is converted by the light wavelength conversion ceramic, can be reflected. Accordingly, the light emitted by the semiconductor light emitting element can be used efficiently, and thereby a decrease in the light intensity or luminance of the light emitted by the light emitting module can be suppressed.

The optical filter may be composed of a multi-layered dichroic mirror that has been formed by alternately depositing and laminating materials having refractive indexes different from each other on one surface of the light wavelength conversion ceramic. Alternatively, for example, a long pass filter, short pass filter, or band pass filter may be adopted.

INDUSTRIAL APPLICABILITY

According to the present invention, a light emitting module emitting the light with high luminance can be provided.

The invention claimed is:
1. A light emitting module comprising:
a light emitting element;
a light wavelength conversion ceramics, formed into a plate shape, configured to convert the wavelength of the light emitted from a light emitting surface of the light emitting element; and
a light guiding member configured to narrow down the area of an emission surface of the light wavelength conversion ceramics to an area smaller than the area of the light emitting surface of the light emitting element, the light that has been transmitted by the light wavelength conversion ceramics being emitted from the emission surface of the light wavelength conversion ceramics.
2. The light emitting module according to claim 1, wherein the light wavelength conversion ceramics is transparent.

3. The light emitting module according to claim 1, wherein the light guiding member is provided on the surface of the light wavelength conversion ceramics.

4. The light emitting module according to claim 1, wherein the light guiding member guides the light such that the light is emitted in a direction approximately parallel to the light emitting surface of the light emitting element.

5. The light emitting module according to claim 2, wherein the light wavelength conversion ceramics has 40 percent or more of the total light transmittance of the light with a wavelength within the conversion wavelength range.

6. The light emitting module according to claim 3, wherein the light wavelength conversion ceramics has a tapered surface that faces an incident surface on which the light from the light emitting element is to be incident and that is inclined with respect to the incident surface, and wherein
the light guiding member is provided on the tapered surface.

7. The light emitting module according to claim 3 further comprising a heat sink provided on the light guiding member.

8. A method of manufacturing a light emitting module, comprising:
providing, in a light wavelength conversion ceramics formed into a plate shape for converting the wavelength of the light emitted from a light emitting surface of a light emitting element incident on an incident surface of the light wavelength conversion ceramics, a light guiding member configured to narrow down the area of an emission surface of the light wavelength conversion ceramics to an area smaller than the area of the surface of the light emitting element, the light that has been transmitted by the light wavelength conversion ceramics being emitted from the emission surface of the light wavelength conversion ceramics; and
arranging the light emitting element and the light wavelength conversion ceramics such that the light emitted by the light emitting element is incident on the incident surface of the light wavelength conversion ceramics.

9. A lamp unit comprising:
a light emitting module including a light emitting element, a light wavelength conversion ceramics, formed into a plate shape, configured to convert the wavelength of the light emitted from a light emitting surface of the light emitting element, and a light guiding member configured to narrow down the area of an emission surface of the light wavelength conversion ceramics to an area smaller than the area of the light emitting surface of the light emitting element, the light that has been transmitted by the light wavelength conversion ceramics being emitted from the emission surface of the light wavelength conversion ceramics; and
an optical member configured to collect the light emitted from the light emitting module.

* * * * *